United States Patent
Chao et al.

(10) Patent No.: US 7,449,123 B2
(45) Date of Patent: Nov. 11, 2008

(54) NANOIMPRINT LITHOGRAPH FOR FABRICATING NANOADHESIVE

(75) Inventors: Chih-Yu Chao, Taipei (TW); Wen-Jiunn Hsieh, Taipei County (TW)

(73) Assignee: Contrel Technology Co., Ltd., Sinshin Township, Tainan County (TW)

( * ) Notice: Subject to any disclaimer, the term of this patent is extended or adjusted under 35 U.S.C. 154(b) by 346 days.

(21) Appl. No.: 11/265,096

(22) Filed: Nov. 3, 2005

(65) Prior Publication Data
US 2007/0018345 A1    Jan. 25, 2007

(30) Foreign Application Priority Data
Jul. 25, 2005    (TW)    .............................. 94125184 A

(51) Int. Cl.
  *C03C 25/68*    (2006.01)
  *B44C 1/22*    (2006.01)
(52) U.S. Cl. .............................. 216/54; 216/41; 216/52; 264/219; 101/483
(58) Field of Classification Search .................... 216/54, 216/41, 52; 264/219; 101/483
See application file for complete search history.

(56) References Cited

U.S. PATENT DOCUMENTS

| 6,792,856 | B2* | 9/2004 | Hall et al. ................. 101/368 |
| 6,946,332 | B2* | 9/2005 | Loo et al. ................... 438/149 |
| 7,218,465 | B1* | 5/2007 | Deeman et al. ............... 360/16 |
| 2002/0130444 | A1* | 9/2002 | Hougham ................... 264/519 |
| 2005/0120902 | A1* | 6/2005 | Adams et al. ................ 101/483 |
| 2005/0133954 | A1* | 6/2005 | Homola ...................... 264/219 |

* cited by examiner

*Primary Examiner*—Shamim Ahmed
(74) *Attorney, Agent, or Firm*—Bacon & Thomas PLLC

(57) ABSTRACT

A nanoimprint lithography method of fabricating a nanoadhesive includes steps of (a) preparing a substrate and a transfer stamp, said transfer stamp having a transfer face and nanometer-scale features formed on said transfer face, said nanometer-scale features having a plurality of convexities and concavities, said substrate having an etched layer; (b) proceeding a staining process to enable either of said convexities and concavities to be stained with a photoresist; (c) proceeding a transfer process to enable said nanometer-scale features to touch said etched layer to transfer said photoresist onto said etched layer; and (d) proceeding an etching process to enable parts of said etched layer that are not stained with the photoresist to be each etched for a predetermined depth. As the steps indicated above, the nanoadhesive can be produced with mass production and low cost.

7 Claims, 7 Drawing Sheets

NANOIMPRINT LITHOGRAPH FOR FABRICATING NANOADHESIVE

BACKGROUND OF THE INVENTION

1. Field of the Invention

The present invention relates generally to nanotechnology, and more particularly, to low-cost and high-throughput nanoimprint lithography method of fabricating a nanoadhesive.

2. Description of the Related Art

In the field of the nanotechnology, the imprint lithography techniques can meet the requirements of mass production and low production cost. Particularly, the imprint lithography technique with the sub-50-nm line-width is essential for the further manufacturing of semiconductor integrated circuits and the commercialization of electronic, optoelectronic, and magnetic nanodevices.

Numerous relevant technologies are under development, like scanning electron beam lithography (K. C. Beard, T. Qi. M. R. Dawson, B. Wang. C. Li, Nature 368, 604 (1994)), x-ray lithography (M. Godinot and M. Mahboubi, C. R. Acad. Sci. Ser. II Mec. Phys. Chim. Chim. Sci. Terre Univers. 319, 357(1994); M. Godinot, in Anthropoid Origins, J. G. Fleagle and R. F. Kay, Eds. (Plenum, N.Y., 1994), pp. 235-295), lithographies based on scanning proximal probes (E. L. Simons and D. T. Rasmussen, Proc. Natl. Acad. Sci. U.S.A. 91, 9946(1994); Evol. Anthropol. 3, 128 (1994)), etc. While the scanning electron beam lithography demonstrated 10-nm resolution, it exposes point by point in a serial manner and thus, the current throughput of the technique is too low to be economically practical for mass production. The x-ray lithography demonstrated 20-nm resolution in a contact printing mode and has a high throughput, but its mask technology and exposure systems are currently rather complex and expensive. The lithographies based on scanning proximal probes, demonstrated a resolution of about 10-nm, but were in the early stages of development and failed to meet the requirements of low production cost and mass production, either.

SUMMARY OF THE INVENTION

The primary objective of the present invention is to provide a low-cost and high-throughput nanoimprint lithography method of fabricating a nanoadhesive.

The foregoing objective of the present invention is attained by the nanoimprint lithography method, which includes the steps of:

preparing a substrate and a transfer stamp, wherein said transfer stamp includes a transfer face and nanometer-scale features formed on the transfer face and having a plurality of convexities and concavities, and the substrate includes an etched layer;

proceeding a staining process to enable either of the convexities and concavities to be stained with a photoresist;

proceeding a transfer process to enable the nanometer-scale features of the transfer stamp to touch the etched layer of the substrate to further transfer the photoresist located on the nanometer-scale features onto a surface of the etched layer; and proceeding an etching process to enable parts of the etched layer that are not stained with the photoresist to be each etched for a predetermined depth.

As the steps indicated above, the nanoadhesive can be produced with mass production and low cost for industrial requirements.

DETAILED DESCRIPTION OF PREFERRED EMBODIMENTS

Referring to FIGS. 1-7, a nanoimprint lithography method of fabricating a nanoadhesive in accordance with a first preferred embodiment of the present invention includes the follows steps.

Figure 1:
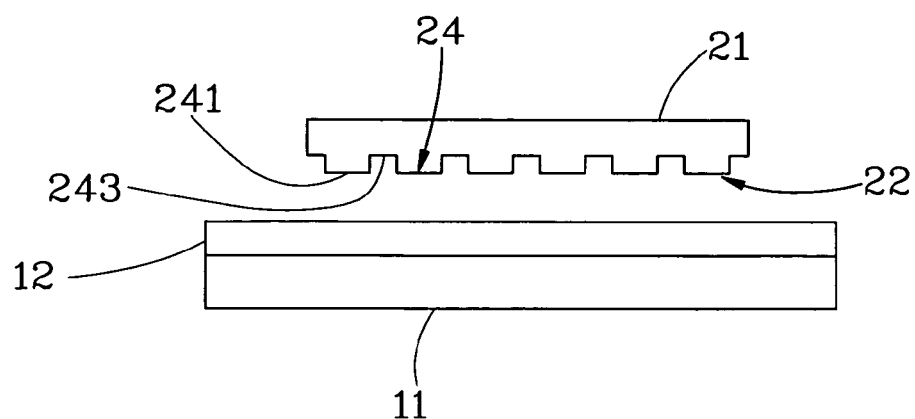
FIG. 1 is a first schematic view of a first preferred embodiment of the present invention at work.

(a) Under a vacuum environment, prepare a substrate 11 and a transfer stamp 21. As shown in FIG. 1, the transfer stamp 21 is plate-like, having a transfer face 22 located on a bottom side thereof and nanometer-scale features 24 formed on the transfer face 22. The nanometer-scale features 24 are formed of a plurality of convexities 241 and concavities 243. The substrate 11 has an etched layer 12 made of polymer.

Figure 2:
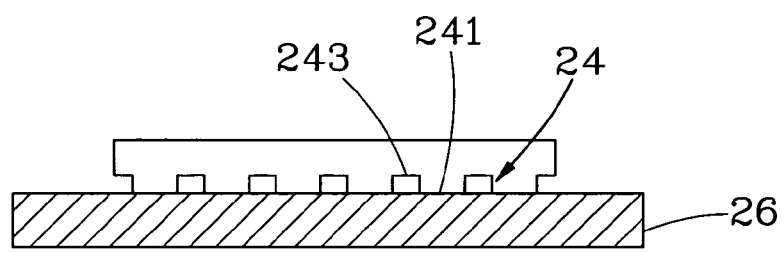
FIG. 2 is a second schematic view of the first preferred embodiment of the present invention at work.
Figure 3:
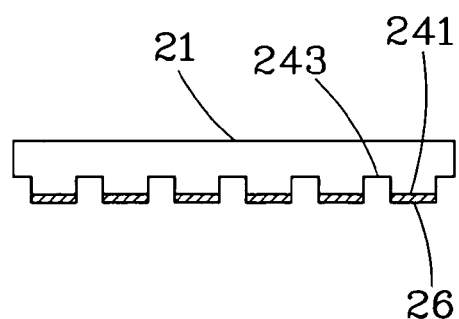
FIG. 3 shows that the convexities of the nanometer-scale features in accordance with the first preferred embodiment of the present invention are stained with the photoresist.
Figure 4:
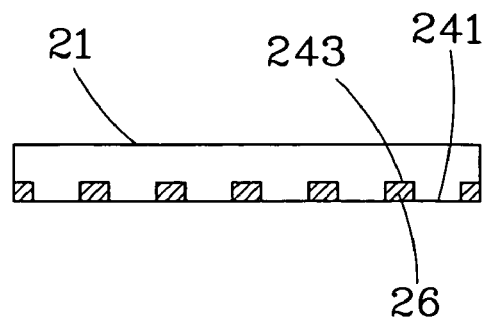
FIG. 4 shows that the concavities of the nanometer-scale features in accordance with the first preferred embodiment of the present invention are filled with the photoresist.

(b) Proceed a staining process, as shown in FIG. 2, to enable either the convexities 241 or the concavities 243 to be stained with a photoresist 26. FIG. 3 shows the convexities 241 stained with the photoresist 26. FIG. 4 shows the concavities 243 filled with the photoresist 26.

Figure 5:
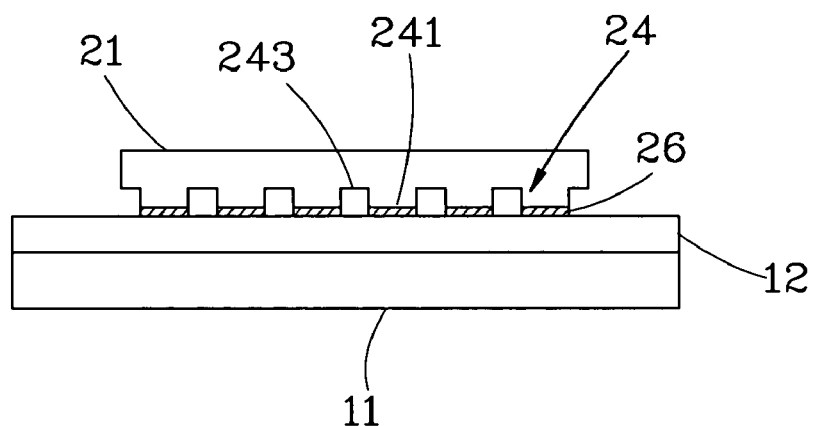
FIG. 5 is a third schematic view of the first preferred embodiment of the present invention at work.
Figure 6:
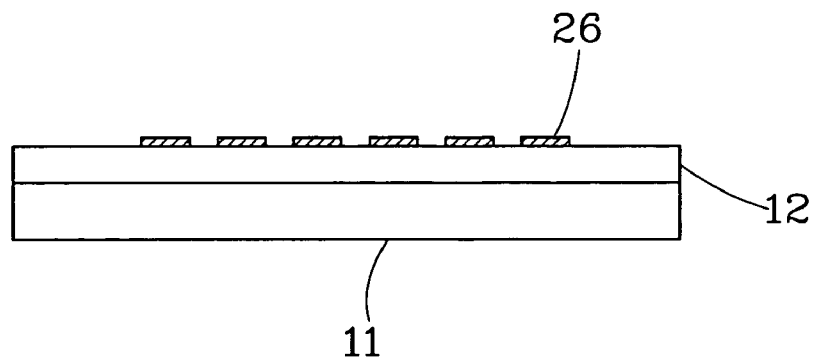
FIG. 6 illustrates the appearance of the substrate after staining process of FIG. 1.
Figure 7:
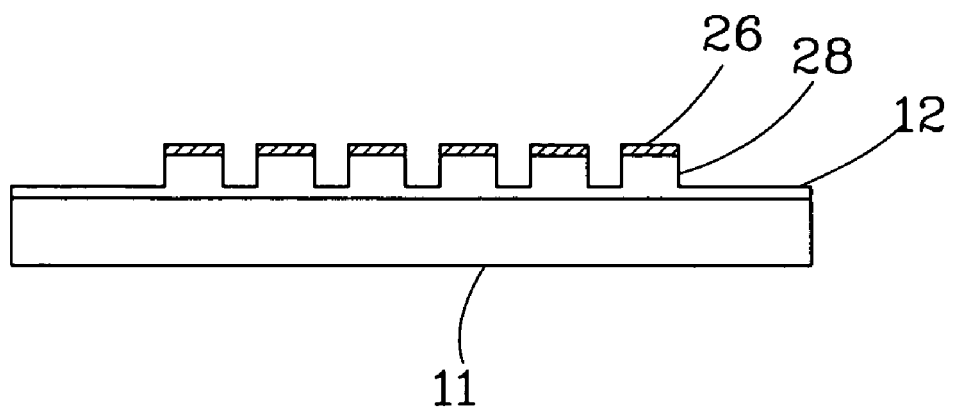
FIG. 7 is a fourth schematic view of the first preferred embodiment of the present invention at work.

(c) Proceed a transfer process to enable the transfer stamp 21 to touch the substrate 11. As shown in FIG. 5, the nanometer-scale features 24 touch the etched layer 12 to enable the photoresist 26 to be transferred onto a surface of the etched layer 12. Either the convexities 241 or concavities 243 stained with the photoresist 26 can enable the photoresist 26 to be transferred onto the surface of the etched layer 12. FIG. 6 shows the substrate 11 on which the photoresist 26 is transferred by the convexities 241. The substrate 11 that the photoresist 26 is transferred by the concavities 243 is similar to that of FIG. 6, such that no further description is necessary.

(d) Proceed an etching process to enable parts of the etched layer 12 that are not stained/covered with the photoresist 26 to be each etched for a predetermined depth to form a plurality of nanometer-scale pillar 28 of predetermined heights on the parts of the etched layer 12. Therefore, the substrate 11 can be directly taken as the nanoadhesive. Alternatively, the etched layer 12 can be unfixed from the substrate II to adhere to other materials for applications of the nanoadhesive.

As indicated above, the nanoadhesive can be produced according to the steps of the method.

Figure 8:
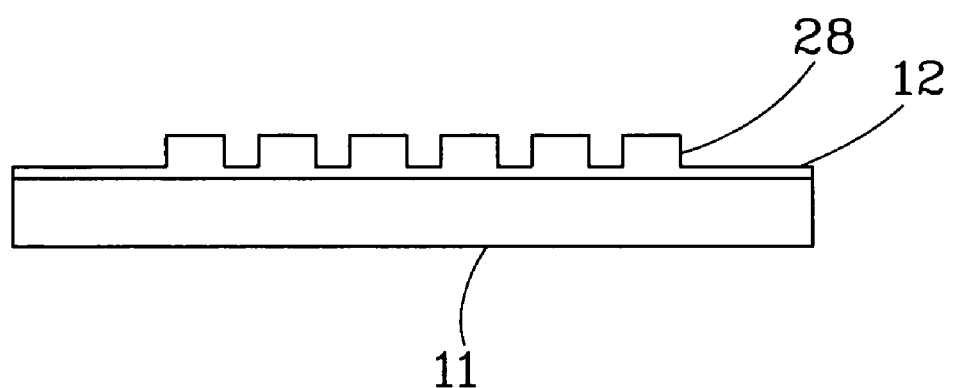
FIG. 8 is a fifth schematic view of the first preferred embodiment of the present invention at work.

Alternatively, the aforementioned method of the first embodiment can include an additional step as follows:

(e) Proceed a cleaning process to remove the photoresist 26 from the substrate 11 with a lotion (not shown). FIG. 8 shows the substrate 11 from which the photoresist 26 is removed. Although the photoresist 26 is still left on tips of the nanometer-scale pillar 28 formed during steps (a)-(d), removing or keeping the photoresist 26 does not bring any influence on absorbability of the nanoadhesive. However, the cleaning process can enable the finished product of the nanoadhesive to be more pure, further eliminating potential variables incurred while the cleaning process is not done.

Referring to FIGS. 9-12, a nanoimprint lithography method of fabricating a nanoadhesive in accordance with a second preferred embodiment of the present invention includes the follows steps.

Figure 9:
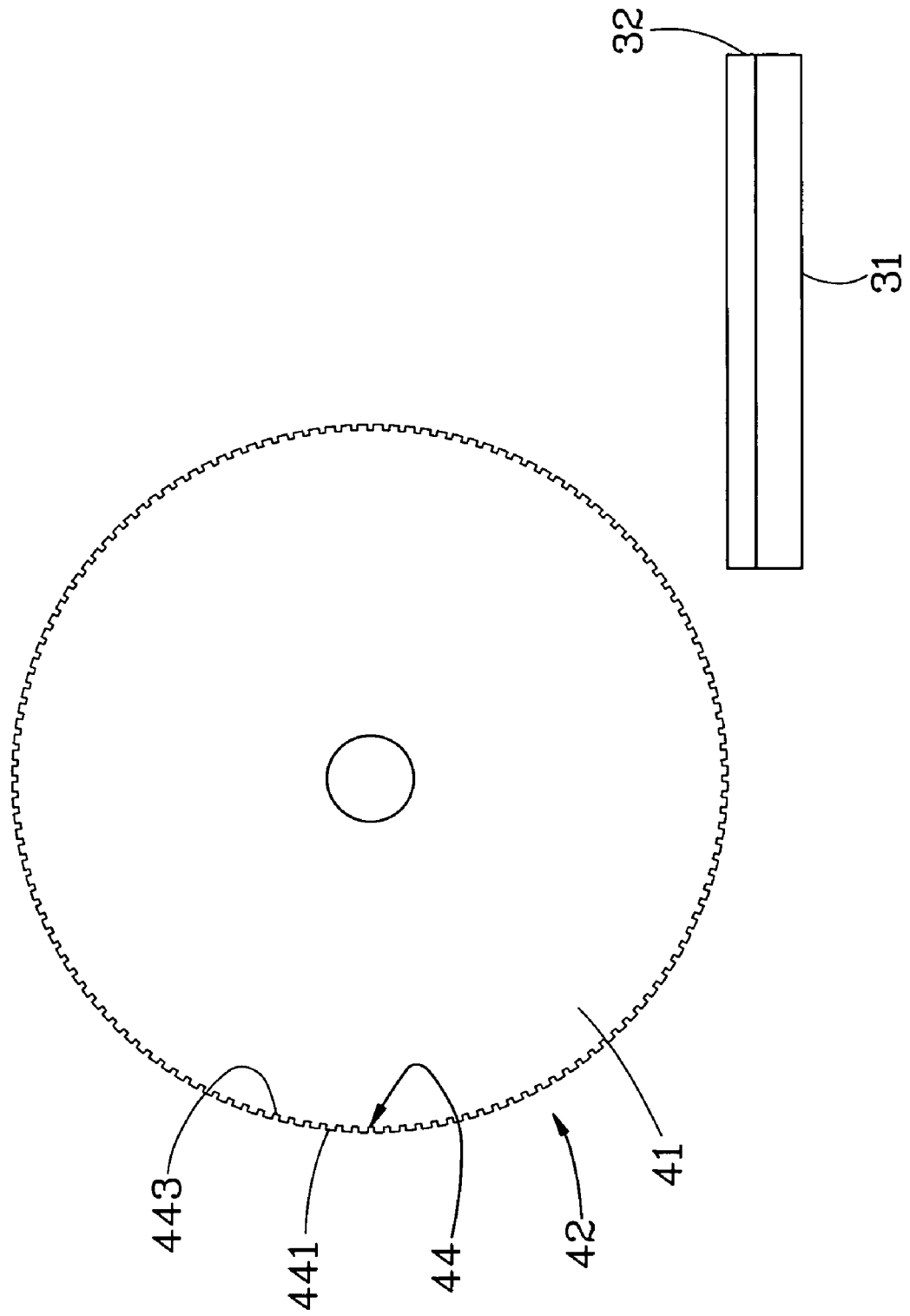
FIG. 9 is a first schematic view of a second preferred embodiment of the present invention at work.

(a) Under a vacuum environment, prepare a substrate 31 and a transfer stamp 41. As shown in FIG. 9, the transfer stamp 41 is roller-like, having a transfer face 42 located on a rolling side thereof and nanometer-scale features 44 formed on the transfer face 42. The nanometer-scale features 44 are formed of a plurality of convexities 441 and concavities 443. The substrate 31 has an etched layer 32.

Figure 10:
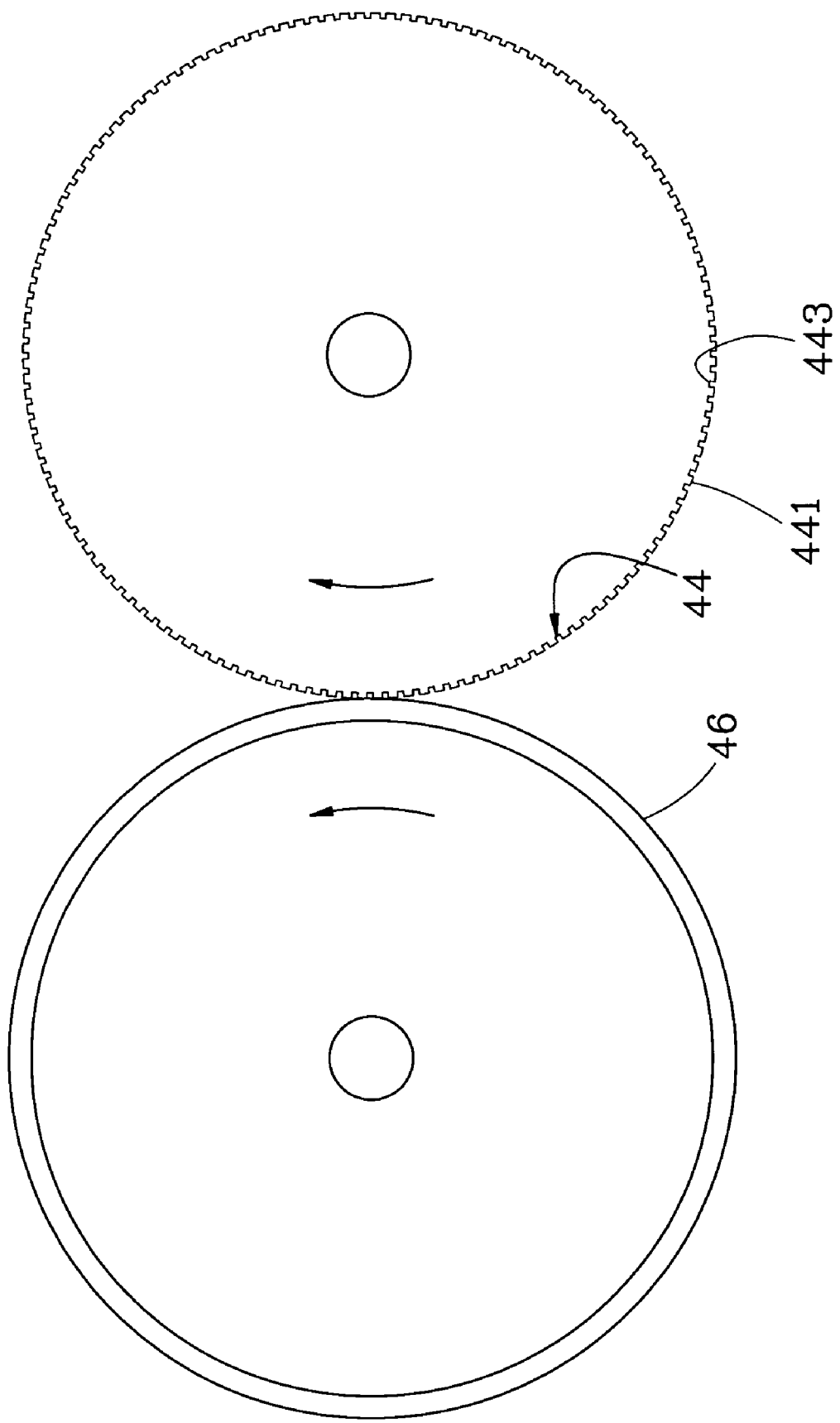
FIG. 10 is a second schematic view of the second preferred embodiment of the present invention at work.

(b) Proceed a staining process, as shown in FIG. 10, to enable either the convexities 441 or the concavities 443 to be stained or filled with a photoresist 46.

Figure 11:
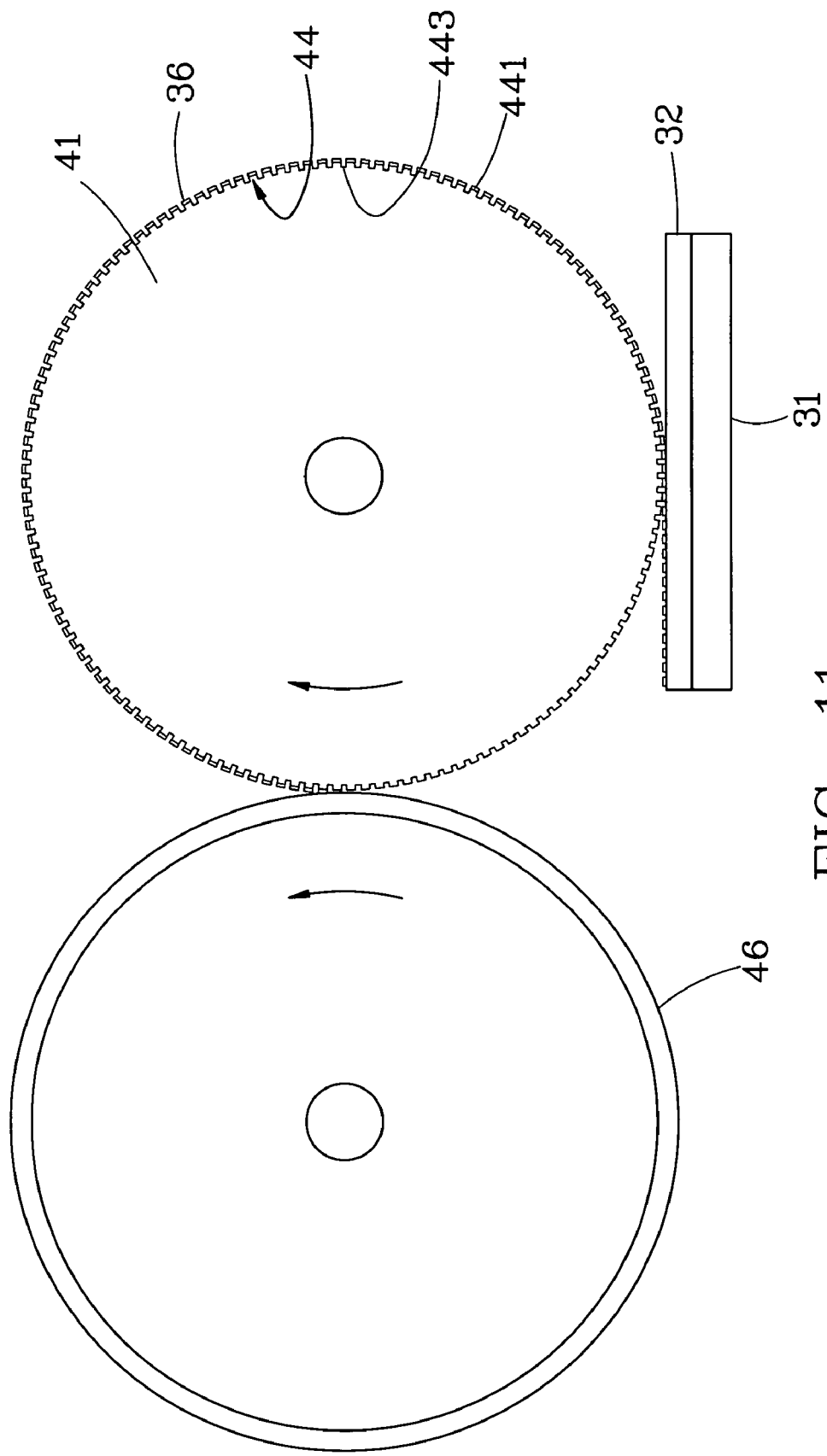
FIG. 11 is a third schematic view of the second preferred embodiment of the present invention at work.

(c) Proceed a transfer process to enable the transfer stamp 41 to roll the substrate 31 by roller printing. As shown in FIG 11, the nanometer-scale features 44 touch the etched layer 32 to enable the photoresist 46 to be transferred onto a surface of the etched layer 32. In this embodiment, the convexities 441 of the nanometer-scale features 44 are stained with the photoresist 46. Since the process that the concavities 443 are stained with the photoresist 46 is similar to that of the convexities 441, no further description is necessary.

Figure 12:
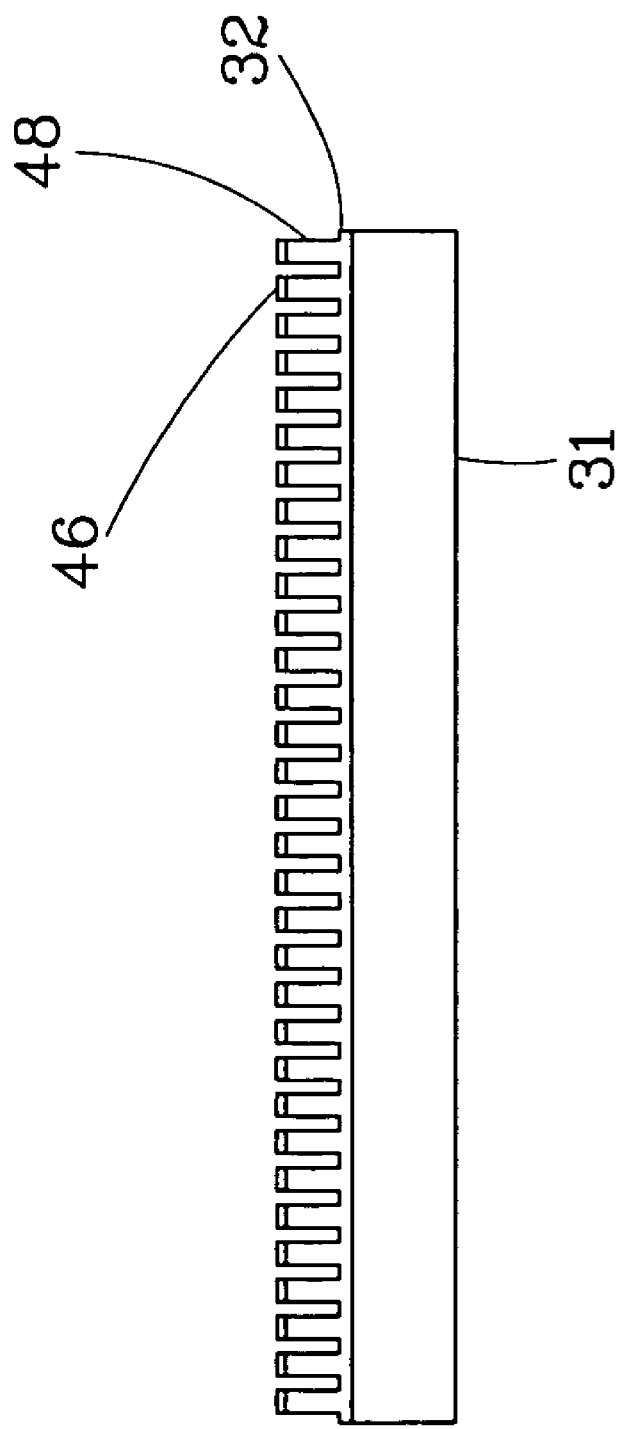
FIG. 12 is a fourth schematic view of the second preferred embodiment of the present invention.

(d) Proceed an etching process, as shown in FIG. 12, to enable parts of the etched layer 32 that are not stained/covered with the photoresist 46 to be each etched for a predetermined depth to form a plurality of nanometer-scale pillar 48 of predetermined thickness on the parts of the etched layer 32. Therefore, the substrate 31 can be directly taken as the nanoadhesive. Alternatively, the etched layer 32 can be unfixed from the substrate 31 to adhere to other materials for applications of the nanoadhesive.

The second embodiment is similar to the first embodiment but different by the shape of the transfer stamp, i.e. plate-like and roller-like, and the manner that the transfer stamp touches the substrate, i.e. touching and roller printing. Further, the method of the second embodiment is adapted for continuous production.

As indicated above, the nanoimprint lithography method of the present invention allows quick and high-throughput production of the nanometer-scale etched layers for the nanoadhesives to achieve the purposes of mass production and low cost, further being superior to the prior art.

What is claimed is:

1. A nanoimprint lithography method of fabricating a nanoadhesive, comprising the steps of:
   (a) preparing under vacuum a substrate and a transfer stamp, said transfer stamp having a transfer face and nanometer-scale features formed on said transfer face, said nanometer-scale features having a plurality of convexities and concavities, said substrate having a layer to be etched;
   (b) staining either of said convexities and concavities with a photoresist;
   (c) transferring said nanometer-scale photoresist features to layer to be etched; and
   (d) proceeding an etching process to enable parts of said etched layer that are not stained with the photoresist to be each etched for a predetermined depth.

2. The nanoimprint lithography method as defined in claim 1 further comprising a step: (e) proceeding a cleaning process to remove said photoresist with a lotion from said substrate.

3. The nanoimprint lithography method as defined in claim 1, wherein said convexities of said nanometer-scale of features are stained with said photoresist in step (b).

4. The nanoimprint lithography method as defined in claim 1, wherein said concavities of said nanometer-scale of features are filled with said photoresist in step (b).

5. The nanoimprint lithography method as defined in claim 1, wherein said layer to be etched is made of polymer in step (a).

6. The nanoimprint lithography method as defined in claim 1, wherein said transfer stamp is plate-like and said transfer face is located on a bottom side of said transfer stamp in step (a); and said transfer stamp touches said layer to be etched in a manner that said nanometer-scale features touch said etched layer in step (c).

7. The nanoimprint lithography method as defined in claim 1, wherein said transfer stamp is roller-like and said transfer face is located on a rolling side of said transfer stamp in step (a); and said transfer stamp touches said layer to be etched in a manner that said nanometer-scale features roll said etched layer by roller printing.

* * * * *